(12) United States Patent
Metodiev et al.

(10) Patent No.: US 6,486,664 B1
(45) Date of Patent: Nov. 26, 2002

(54) MAGNETIC FIELD EXPOSURE SENSOR AND ANALYSIS SYSTEM

(75) Inventors: Mario Metodiev, West Babylon, NY (US); Metodi Filipov, West Babylon, NY (US)

(73) Assignee: Lepel Corp., Edgewood, NY (US)

( * ) Notice: Subject to any disclaimer, the term of this patent is extended or adjusted under 35 U.S.C. 154(b) by 0 days.

(21) Appl. No.: 09/716,857

(22) Filed: Nov. 20, 2000

Related U.S. Application Data

(63) Continuation-in-part of application No. 09/108,931, filed on Jul. 1, 1998, now abandoned.

(51) Int. Cl.[7] ..................... G01R 33/02; G01R 33/10; H05B 6/06
(52) U.S. Cl. ................... 324/258; 324/117 R; 324/260; 219/650; 340/870.16
(58) Field of Search ................ 324/95, 117 R, 324/127, 202, 244, 247, 258, 260, 261; 219/650; 340/870.02, 870.16

(56) References Cited

U.S. PATENT DOCUMENTS

| | | | |
|---|---|---|---|
| 3,428,896 A | 2/1969 | Schweitzer, Jr. | 324/117 R |
| 3,604,882 A | 9/1971 | Seyfried | 219/650 |
| 3,914,689 A | 10/1975 | Wright | 324/119 |
| 4,237,360 A | 12/1980 | Pohlenz | |
| 4,634,969 A | 1/1987 | Edlin et al. | 324/95 |
| 4,659,984 A | 4/1987 | Doss | 324/95 |
| 4,684,554 A | 8/1987 | Ou-Yang | |
| 5,003,260 A | 3/1991 | Auchterlonie | |
| 5,311,126 A | 5/1994 | Mittleman et al. | 324/258 X |
| 5,376,245 A | 12/1994 | McLeod | 324/247 X |
| 5,432,437 A | 7/1995 | Turner | 324/95 |
| 5,440,232 A | 8/1995 | Scarzello et al. | 324/247 |
| 5,458,142 A | 10/1995 | Farmer et al. | 324/260 X |
| 5,608,319 A | 3/1997 | Maurer et al. | 324/260 X |
| 5,773,974 A | * 6/1998 | Kraz | 324/258 |
| 5,789,920 A | * 8/1998 | Gass | 324/260 |

FOREIGN PATENT DOCUMENTS

| | | |
|---|---|---|
| FR | 2 352 305 | 5/1976 |
| GB | WO 82/02593 | 8/1982 |

* cited by examiner

Primary Examiner—Gerard R. Strecker
(74) Attorney, Agent, or Firm—Philip O. Post

(57) ABSTRACT

A compact magnetic field exposure sensor and analysis system suitable for use in the calibration of induction heating processes such as foil cap sealing or the heat treatment of metals. The compact sensor is a self-contained sensing coil, and signal storage, processing and/or transmitting components that can be configured to suit narrow-mouth containers. Detected and/or processed signals can be transmitted to remote storage, processing and/or display subsystems from the sensor.

19 Claims, 5 Drawing Sheets

MAGNETIC FIELD EXPOSURE SENSOR AND ANALYSIS SYSTEM

CROSS-REFERENCE TO RELATED APPLICATIONS

This application is a continuation-in-part of U.S. application No. 09/108,931 filed on Jul. 1, 1998, now abandoned the disclosure of which is hereby incorporated by reference in its entirety.

FIELD OF THE INVENTION

The present invention relates to exposure analysis systems to calibrate induction heating processes used in container sealing, metal hardening or annealing, and, more specifically, to magnetic field exposure sensors used in those exposure analysis systems.

BACKGROUND OF THE INVENTION

Induction heating processes are used in-a variety of applications from sealing of bottles for pharmaceuticals to induction hardening of metals and annealing of parts. The process in the factory must be monitored for proper performance and for quality control statutory requirements. If the process parameters are not within specifications, the consequences could be very damaging.

In a bottle sealing process several problems can occur. Underexposure can cause a weak or incomplete seal resulting in an inability to keep out contaminants such as bacteria or viruses which could be fatal. Overexposure causes excessive heat in the foil layer which can cosmetically char the paper layer in contact with it or even degrade the plastic container.

Similarly, in an induction hardening process, the temper and surface hardness of the treated parts may not meet specifications, resulting in premature wear or catastrophic failure. In an annealing process, residual co stresses in the parts can cause failure with costly consequences.

Since induction heating processes involve the use of high frequency In (HF) magnetic fields, prior art in the measurement of this type of magnetic radiation is of some relevance. U.S. Pat. No. 3,914,689 of Wright disclose a self powered temperature-compensated rectifier for measuring current to assess the power in radio frequency waves; it does not require an additional source of power. French Patent No. 76 15704 of Bourgeois describes a method and an apparatus for measuring the magnetic vector, of an electromagnetic wave by incorporating a Faraday shield to exclude the electric field. U.S. Pat. No. 4,659,984 of Doss describes a passive integrating electromagnetic field dosimeter incorporating the use of an electrochemical cell. U.S. Pat. No. 5,432,437 of Turner relates to an exposure meter for use with induction heat sealing of containers. By using bottle caps with imbedded sensor coils and other apparatus, either integrated exposure values or instantaneous magnetic field readings can be indicated or transmitted to adjacent indicating meters.

Other background art includes PCT publication Ser. No. 82/12593 of Payne for a device which senses temperature variations in a material in a welding process and U.S. Pat. No. 3,604,882 of Seyfried for a sensing coil for analyzing induction heating and regulating voltage applied thereto. U.S. Pat. No. 3,914,689 of Wright describes a current measuring device, U.S. Pat. No. 4,634,969 of Edlin for a magnetic field safety probe to alert personnel, and U.S. Pat. No. 4,684,554 of Ou-Yang for a sealable container material.

However, there are inherent limitations with the prior art. For example, instantaneous readings or integrated exposure readings, such as described in Turner '437, do not suffice to analyze the operation of induction heating equipment in a comprehensive manner.

Therefore, it is an object of the present invention to provide comprehensive exposure analysis of induction heating equipment to predict its accurate operation.

It is also an object of the present invention to sense the magnitude of a magnetic field produced by current flowing in an induction heating coil with a compact sensor that can include circuitry to process the sensed parameter and/or transmit the sensed parameter or processed data to a remote device.

It is also an object of the present invention to sense the magnitude of a magnetic field produced by current flowing in an induction heating coil over time by providing a signal proportional to the peak value of the magnetic field.

It is a further object of this invention to convert this signal to digital form and to store the digital values in a digital storage device.

It is another object of this invention to convert this signal using a voltage-to-frequency converter.

It is yet another object of this invention to transmit the data to a remote receiver by RF wireless transmission.

It is still another object of this invention to transfer the stored digital data to a computer or display device by a wire connection after the data have been collected.

It is also an object of this invention to use power supplied by the measured field to convert and store and/or to transmit the collected data.

It is further an object of this invention to provide multiple output of the data as field strength versus time, total energy, or average energy, as desired, from a single collection operation.

It is also an object of this invention to use multiple sensing coils to scan wider areas and to detect power from several points simultaneously.

It is yet another object of this invention to use a multi-channel analog-to-digital converter and a single microprocessor to accumulate data from several sensing coils simultaneously.

It is yet another object of this invention to improve over the limitations and disadvantages of the prior art.

SUMMARY OF THE INVENTION

In keeping with these objects and others which may become apparent, the present invention includes a high frequency magnetic field exposure sensor suitable for use in the induction heat sealing, hardening, or annealing of a member, during which operation each member passes beneath an induction coil.

The sensor of the sensing apparatus of the present invention includes a magnetic field sensing coil designed to be exposed to the same high frequency (HF) magnetic flux as the member receives during the induction heating operation.

A signal is produced proportional to the peak value of the magnetic field, as picked up by the sensing coil, and an overall power profile is detected by the sensing coil. The signal and power profile are converted into digital data and the data is stored in a digital storage device. The data are transmitted to a remote receiver, then transferred from the receiver and processed.

The sensing apparatus of the present invention preferably includes a power supply of different configurations, such as a means for using power from the measured field for the sensor, a rechargeable battery, or a replaceable battery.

When power is derived from the measured field, a capacitor is used, acting as an accumulator.

The apparatus may also provide multiple output of the data as field strength versus time, total energy, and average energy from a single collection operation. Multiple sensing coils may be used to scan wider areas and to detect power from several points simultaneously.

In addition, the analog-to-digital converter may be a multi-channel analog-to-digital converter using a single microprocessor to accumulate data from several sensing coils simultaneously.

Furthermore, the sensor apparatus may have a field presence detector for constantly monitoring for the presence of a magnetic field, maintaining the sensor in a sleep mode in the absence of a magnetic field, and producing a wake-up signal when a magnetic field appears, so it is only used intermittently, when needed.

Moreover, the obtained data may be transmitted by a wireless transmitter, or a non-volatile storage apparatus and a port for later access to the data.

Furthermore, the transmitter may be a real time transmitter of data which transmits data as the data in question are measured, wherein the receiver stores the measured data in a storage device located at the receiver.

In an alternate embodiment, the present invention includes a high frequency magnetic field exposure sensor, but uses a voltage-to-frequency converter. This sensor is also suitable for use in an induction heat sealing process for heat sealing the metal foil wad elements in a closure to a container to be closed by the closure, during which operation each closure passes beneath an induction coil of an induction heat sealing apparatus.

This sensor includes a magnetic field sensing coil designed to be exposed to the same high frequency (HF) magnetic flux as the metal foil wad elements of the closures receive during the induction heat sealing operation.

A signal is produced proportional to the peak value of the magnetic field as picked up by the sensing coil and an overall power profile as detected by the sensing coil.

The signal and the resultant power profile are converted into a frequency modulated radio frequency signal, which is transmitted to a remote receiver in real time. Then the signal is converted into digital data, which are stored in a digital storage device and transferred to a means for processing the data.

The invention may also have a power supply of different configurations, such as a means for using power from the measured field for the sensor, a rechargeable battery, or a replaceable battery. Moreover, the transmitting means may be a wireless transmitter.

In general, the present invention provides several exposure analysis systems with accurate power profiles and other important information to calibrate induction heating processes used in container sealing for pharmaceuticals, or induction metal hardening or annealing of parts.

DESCRIPTION OF THE DRAWINGS

The present invention can best be understood in conjunction with the accompanying drawings, in which.

DETAILED DESCRIPTION OF THE INVENTION

As shown in FIGS. 1–10, the present invention enables one to measure and calculate the total energy, maximum field strength, average field strength, and time of field exposure for analyzing the accuracy of induction heating processes.

In addition, the instantaneous field strength is plotted over time. Thus, the field distribution can be visualized based on measured samples of the field envelope. This latter information provides a basis for induction coil alignment, coil turn spacing uniformity, and detection of shorted turns. Field strength, conveyor line speed, and distance of sensor to coil along the conveyor can also be assessed by this robust time coherent data stream. The overall power profile can be measured and stored as sample data files being later retrieved for regression analysis (or merely as a reference) for quality control purposes. The sensor used with the exposure analysis system of the present invention, as further described below, is quite small such as, for example, two inches by ⅜ inch, and its versatile mechanical design makes it possible for the sensor to be used as a stand-alone device or as mounted to a cap of a bottle or other sealable container sealed by an induction heating process.

Figure 1:
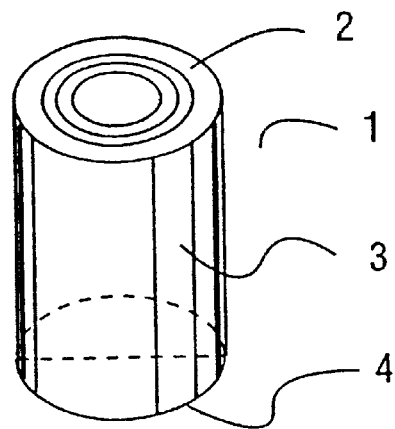
FIG. 1 is a perspective view of a sensor for the exposure analysis system of the present invention, useful for analyzing induction heating processes.
Figure 2:
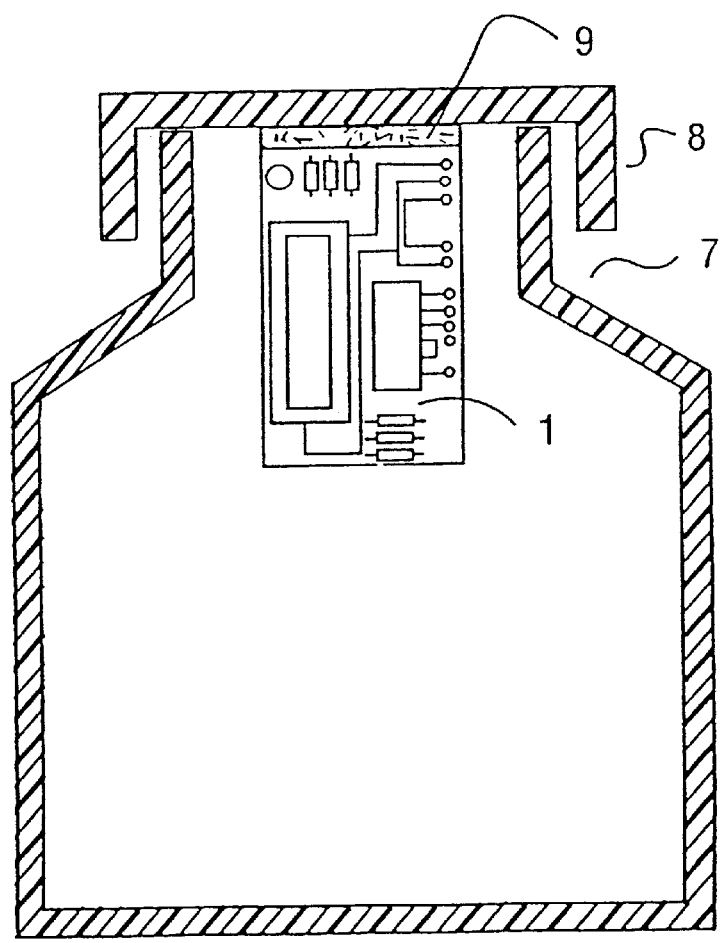
FIG. 2 is a side view in cross section of the sensor as in FIG. 1, shown attached to the cap of a sealable container.

FIG. 1 shows a sensor 1 with sensing coil 2, circuit board 3 with electronic components, and enclosure 4. FIG. 2 shows a side view of sensor 1 attached to cap 8 of container 7 by a layer of adhesive 9, such as double-sided adhesive tape.

Figure 3:
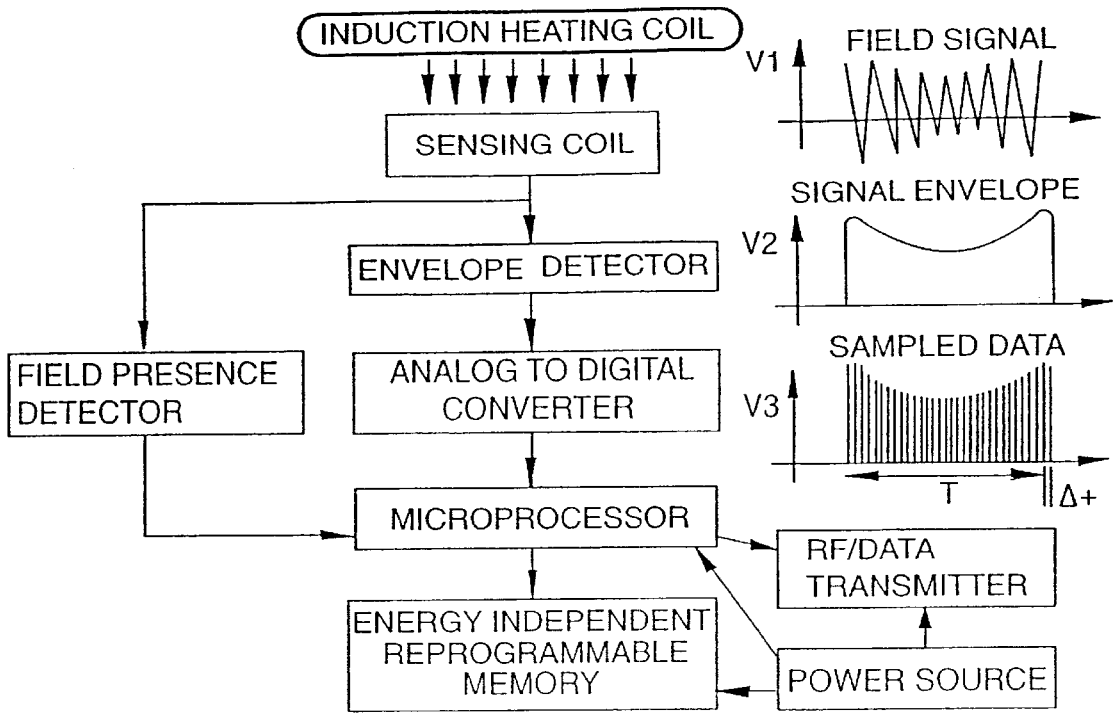
FIG. 3 is a block diagram of the sensor apparatus of the present invention using an analog-to-digital converter.

FIG. 3 is a block diagram of a sensor for exposure analysis of induction heating processes, using an analog-to-digital converter. The induction heating coil induces a high frequency (HF) magnetic field which is sensed by the sensing coil. The field presence detector, mounted on the circuit board, constantly monitors for the presence of a magnetic field.

Normally the electronic circuits and the microprocessor mounted on the circuit board are in a sleep mode (energy saving mode). When a field or signal is detected, a wake-up signal is presented to the circuit and the microprocessor by the field presence detector to start the measurement and transmission of the data. When the measurement is done (i.e., no field detected by the sensing coil), the circuit goes back to a sleep mode.

The power source can be a primary or rechargeable (secondary) battery located on the circuit board. The power can be alternately supplied by the measured field itself and stored in a capacitor used as an accumulator. The envelope detector on the circuit board rectifies and converts the signal from the sensing coil to a signal proportional to the peak value of the magnetic field. The high frequency component is filtered out.

The analog-to-digital converter on the circuit board then converts this envelope signal to digital form for onboard processing by the microprocessor. This data can be stored in non-volatile storage (energy independent reprogrammable memory) for a later transmission, such as, for example, to an RS232 port wire hookup transmission, for field profile plotting and other presentations. It can also be transmitted in real time via an RF/data transmitter located on the circuit board. In this case, the data can be used as a feedback component in a closed-loop process control system or in a supervisory control system using periodic parameter updates. The wave shapes of the field signal, signal envelope, and the sampled data are also shown in FIG. 3. Calculated parameters such as total energy, average value, and time of measurement can be derived as follows:

where K=data sample value;
N=total number of samples;
and ΔT=sampling interval
Total energy (E):

$$E = \sum_{K=1}^{N} K$$

Time of Measurement Mr):

$$T = N \cdot \Delta T$$

Average Value (V):

$$V = \frac{E}{T} = \frac{\sum_{K=1}^{N} K}{N \cdot \Delta T}$$

Figure 4:
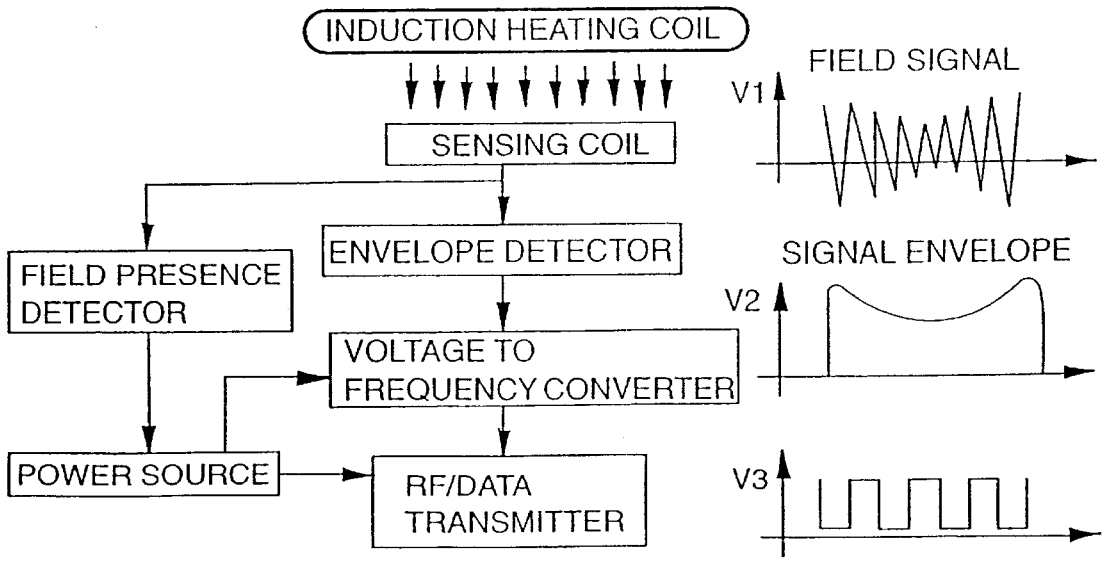
FIG. 4 is a block diagram of another embodiment for a detector apparatus using a voltage-to-frequency converter.

FIG. 4 shows a block diagram for another embodiment where the data conversion from the envelope detector is handled by a voltage-to-frequency converter. In this case the signal is then transmitted as a frequency modulated signal in real-time by the RF/data transmitter to a remote receiver which can display the data, and convert the data to a digital stream and store the data as a data file.

In this system, the sensor has no processor or data storage capability. When RF wireless data transmission is used, it is possible for the sensor to be placed in closed containers or on fast moving conveyors without data loss. In this system, the field can supply the necessary power and the data is simply transmitted in real-time while the sensor is exposed to the field.

Figure 5:
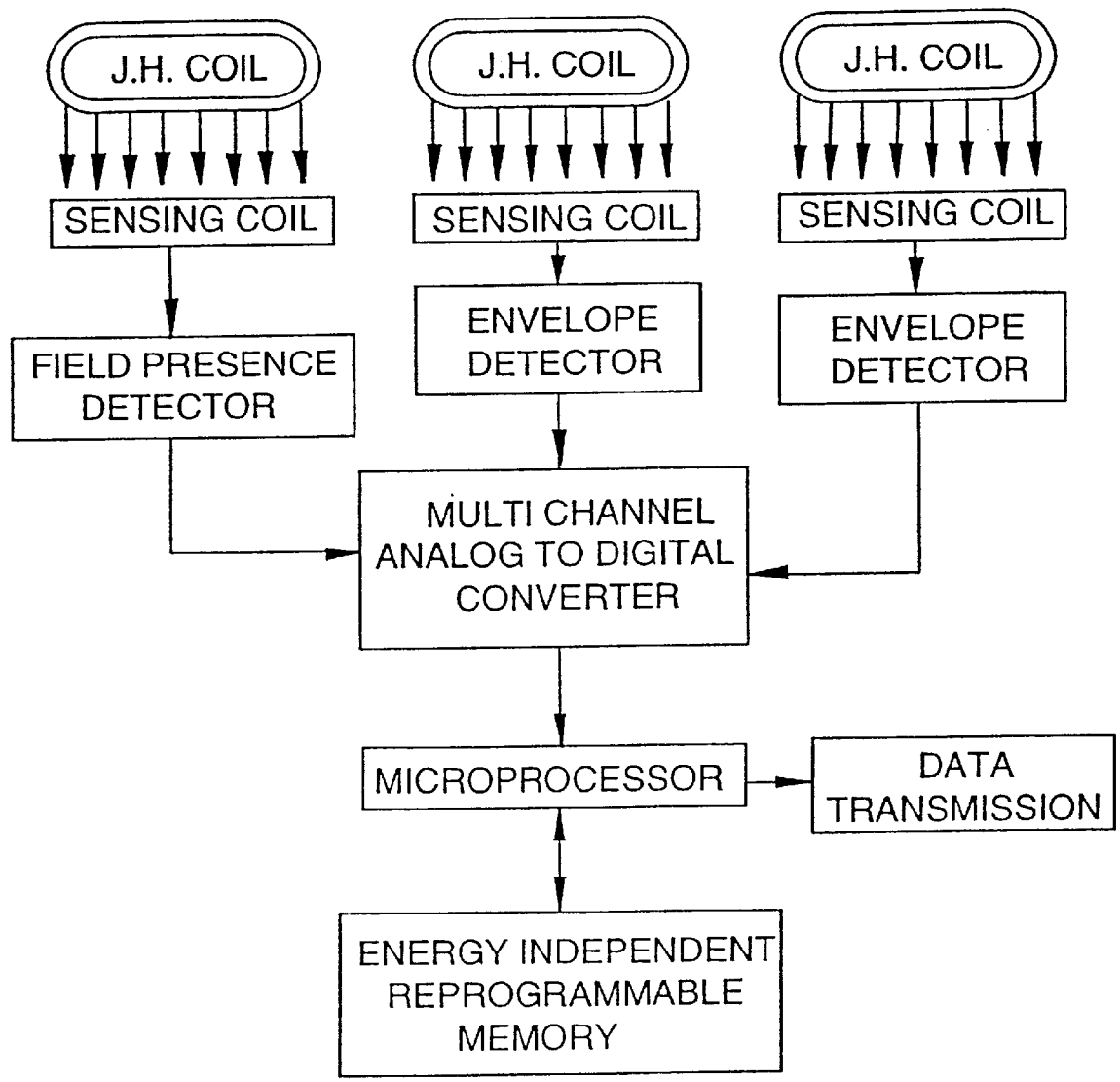
FIG. 5 is a block diagram of another embodiment for a system for analyzing induction heating processes, wherein the system uses multiple sensing coils.

FIG. 5 shows a block diagram of a system accumulating data streams from three different induction heating coils via three different sensing coils. The data is converted by a multi channel analog-to-digital (A/D) converter which is an analog-to-digital (A/D) converter preceded by a multiplexer that can handle multiple data streams.

Figure 6:
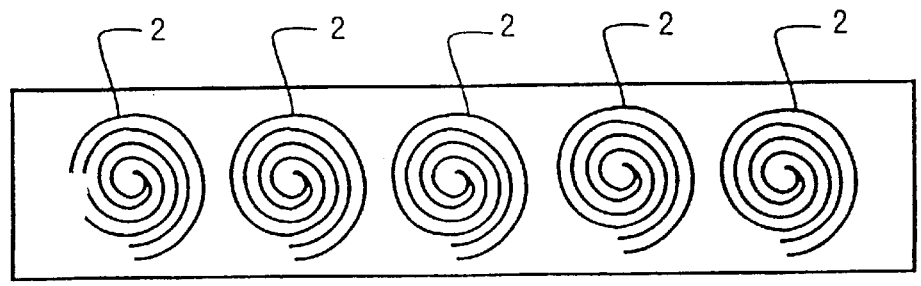
FIG. 6 is a top plan view of another embodiment for a five-coil scanner.

FIG. 6 shows a top view of five sensor coils 2 in an array. This array of is used to scan wider areas and give a power profile of several points simultaneously.

One important application of this invention is in the induction cap sealing used widely in the pharmaceutical, food, and chemical packaging industries. The quality of the seals can be inferred by monitoring the energy of the magnetic field. The quality of the seal depends on the amount of energy dissipated in the aluminum foil. This energy is proportional to the speed of the conveyor, the field strength, and the distance between the coil and the bottle cap. If any of these parameters change, the total energy will change and the quality of the seal will be affected, causing a significant amount of production to be wasted. Excessive energy due to a slower conveyor, stronger than normal field, or smaller distance between bottle cap and induction coil, causes overheating and melting of bottle edges. Insufficient energy will not seal the bottle.

Figure 7:
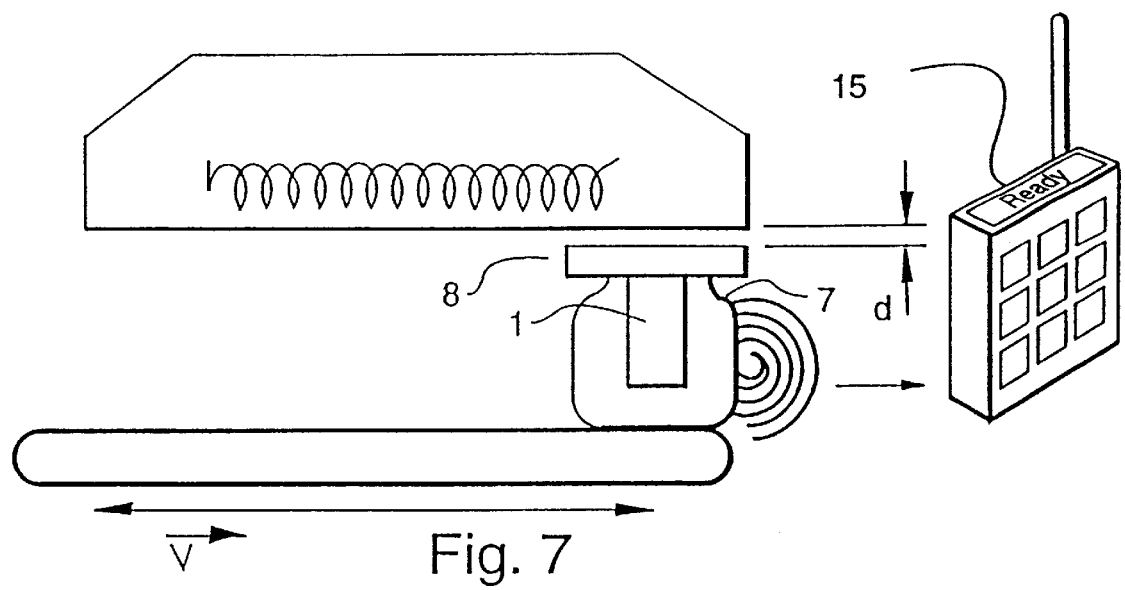
FIG. 7 is a side elevational view of an exposure analysis system for an induction heating process for a bottle sealing operation.

FIG. 7 shows a side view of this application with sensor 1 attached to cap 8 inside container 7. Distance "d" is that from the induction coil to the bottle cap. Sensor 1 transmits data to receiver 15 which can display summary parameter statistics or can interface to a computer to provide plots of parameters. The field sensor measures the total energy, the average field strength, and the time of exposure, and compares them with the normal parameters, providing information for the consistency and quality of the sealing process.

Figure 9:
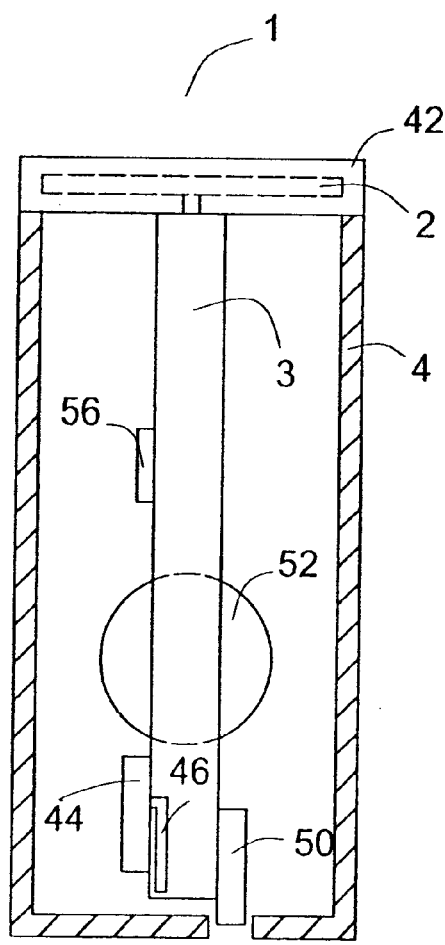
FIG. 9 is a first elevational view in partial cross section of one embodiment of a sensor for sensing a magnetic field for analysis in accordance with the present invention.
Figure 10:
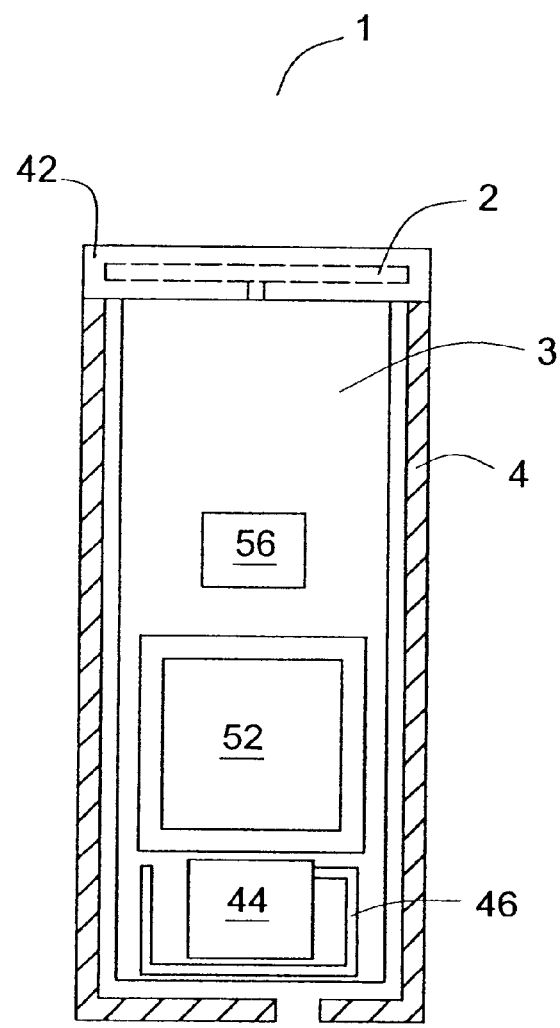
FIG. 10 is a second elevational view in partial cross section of one embodiment of a sensor for sensing a magnetic field for analysis in accordance with the present invention.

FIG. 9 and FIG. 10 illustrate one embodiment of the magnetic field exposure sensor 1 of the present invention. FIG. 9 is a view of the sensor looking at the edge of circuit board 3 and FIG. 10 is a view of the sensor looking at one mounting surface of circuit board 3 (both views showing enclosure 4 in cross section). In this embodiment, the sensing coil 2 is embedded in a non electrically conductive material, such as a phenolic plastic, that forms a part 42 of the enclosure for the sensor. Circuit board 3 is orthogonally aligned along its length with the plane in which part 42 and the embedded sensing coil 2 lie. The edge of the circuit board abutting part 42 provides a convenient means for connecting the end of coil 2 to the circuit board. At the opposing edge of circuit board 3, a suitable miniature transmitter module 44 such as RF Monolithic, Inc., Dallas, Tex., Part No. HX1003, is disposed on the circuit board and serves as the previously described RF/data transmitter. Antenna 46 is connected to the RF output of module 44 and can be suitably formed from a conductive trace on the circuit board or by embedding a radiating element in the board.

Jack 50 is mounted on circuit board 3 to provide a convenient means of connecting the battery charging circuit in the sensor to an external power source for recharging battery 52. In this embodiment, battery 52 is situated in an opening in circuit board 3 to minimize the outer profile of the circuit board when the battery is mounted on the circuit board. Further, in this configuration, the battery serves to provide a degree of electromagnetic shielding for processing components mounted on the circuit board in the area above the battery and below the sensing coil, which is generally the circuit board area reserved for signal processing components, such as processor 56, and other components used to perform the onboard storing and/or processing functions as further described above.

In one embodiment, part 42 is in the shape of a disc and enclosure 4 is substantially cylindrical in shape. As previously mentioned, this embodiment provides a better than 2:1 ratio in length to diameter form that is of particular value for narrow-mouth containers with a relatively small opening cross section and sealing foil.

Figure 8:
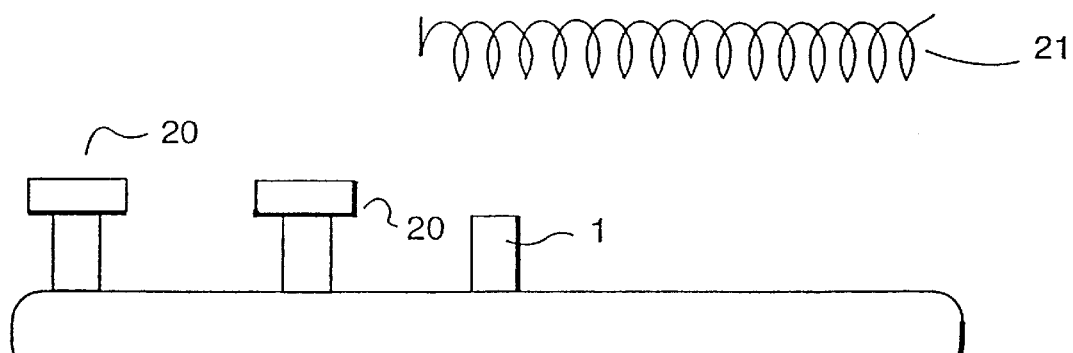
FIG. 8 is a side elevational view of an exposure analysis system for an induction heating process for a heat treating system.

FIG. 8 shows a side view of an industrial heat treating process such as hardening or annealing. Parts 20 follow sensor 1 on a conveyor. Field strength profiling around induction coil 21 produces a power profile and field distribution of induction heating coil 21. The field distribution

What is claimed is:

1. A magnetic field exposure sensor for use in a high frequency induction treatment operation of a member, during which operation the sensor passes beneath an induction coil in which a current flow produces a high frequency magnetic field, the sensor comprising:
an enclosure;
a magnetic field sensing coil for sensing the high frequency magnetic field, the sensing coil disposed in a part of the enclosure;
a circuit board contained within the enclosure, an edge of the circuit board abutting the part of the enclosure in which the sensing coil is disposed, the circuit board comprising:
processing circuitry further comprising:
means for producing a signal proportional to the peak value of the magnetic field as sensed by the sensing coil;
means for producing an overall power profile from the signal proportional to the peak value of the magnetic field, the overall power profile being the peak value of the magnetic field as the sensor passes beneath the induction coil;
means for converting the signal proportional to the peak value of the magnetic field into a first digital data;
means for converting the overall power profile into a second digital data;
means for storing the first and second digital data in a digital storage device; and
transmitting circuitry comprising means for transmitting the digital data to a remote receiver.

2. The apparatus of claim 1 wherein the sensing coil is disposed in a part that lies in a plane orthogonally oriented with the length of the circuit board.

3. The apparatus of claim 1 further comprising a power supply disposed on the circuit board to supply power for the processing and transmitting circuitry.

4. The apparatus of claim 3 wherein said power supply physically separates the transmitting circuitry from the processing circuitry.

5. The apparatus of claim 3 wherein said power supply is a rechargeable battery.

6. The apparatus of claim 5 further comprising a jack mounted on the circuit board and connected to the power supply, the jack being accessible for connection to an external charging source for charging the battery without removal of the battery or circuit board from the enclosure.

7. The apparatus of claim 1 further comprising a plurality of magnetic field sensing coils disposed in a part of the enclosure to simultaneously detect the magnetic field at a plurality of points.

8. The apparatus of claim 7, the processing circuitry further comprising a multi-channel analog-to-digital converter and processor to simultaneously process the magnetic field detected at the plurality of points.

9. The apparatus of claim 1, the processing circuitry further comprising a field presence detector to monitor for the presence of the magnetic field at the sensing coil, maintain the sensor in a sleep mode in the absence of the magnetic field at the sensing coil, and produce a wake-up signal when the magnetic field is present at the sensing coil.

10. The apparatus of claim 1 wherein the transmitting circuitry comprises a wireless transmitter.

11. The apparatus of claim 10 wherein the wireless transmitter further comprises an antenna disposed on the circuit board.

12. The apparatus of claim 1 wherein the transmitting circuitry comprises a non-volatile storage device and a port for access to said stored data, the means for transmitting the digital data and the port being disposed on the circuit board.

13. A magnetic field exposure sensor suitable for use in an induction heat sealing process for heat sealing the metal foil wad elements in a closure to a container to be closed by the closure, during which operation each closure passes beneath an induction coil of an induction heat sealing apparatus, a current flow in the induction coil producing a high frequency magnetic field, the sensor removable attachable to the closure, the sensor comprising:
an enclosure;
a magnetic field sensing coil for sensing the high frequency magnetic field, the sensing coil disposed in a part of the enclosure;
a circuit board contained within the enclosure, an edge of the circuit board abutting the part of the enclosure in which the sensing coil is disposed, the circuit board comprising:
processing circuitry further comprising:
means for producing a signal proportional to the peak value of the magnetic field as sensed by the sensing coil;
means for producing an overall power profile from the signal proportional to the peak value of the magnetic field, the overall power profile being the peak value of the magnetic field as the sensor passes beneath the induction coil; and
means for converting the signal proportional to the peak value of the magnetic field into a frequency modulated radio frequency signal;
means for converting the overall power profile into a frequency modulated radio frequency signal; and
transmitting circuitry comprising means for transmitting the frequency modulated radiofrequency signal to a remote receiver in real time for further processing.

14. The apparatus of claim 13 wherein the sensing coil is disposed in a part that lies in a plane orthogonally oriented with the length of the circuit board.

15. The apparatus of claim 14 further comprising a power supply disposed on the circuit board to supply power for the processing circuitry and transmitting circuitry.

16. The apparatus of claim 15 wherein said power supply physically separates the transmitting circuitry from the processing circuitry.

17. The apparatus of claim 16 wherein said power supply is a rechargeable battery.

18. The apparatus of claim 17 further comprising a jack mounted on the circuit board and connected to the power supply, the jack being accessible for connection to an external charging source for charging the rechargeable battery without removal of the battery or circuit board from the enclosure.

19. The apparatus of claim 15, wherein the container is a narrow-mouth container.

* * * * *